United States Patent
Furse et al.

(10) Patent No.: US 7,250,772 B2
(45) Date of Patent: Jul. 31, 2007

(54) METHOD AND APPARATUS FOR CHARACTERIZING A SIGNAL PATH CARRYING AN OPERATIONAL SIGNAL

(75) Inventors: Cynthia Furse, Salt Lake City, UT (US); Paul Smith, West Valley City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 11/198,900

(22) Filed: Aug. 4, 2005

(65) Prior Publication Data

US 2006/0012376 A1    Jan. 19, 2006

Related U.S. Application Data

(63) Continuation-in-part of application No. PCT/US2004/003343, filed on Feb. 4, 2004, which is a continuation-in-part of application No. PCT/US03/37233, filed on Nov. 19, 2003, application No. 11/198,900, which is a continuation-in-part of application No. 11/133,145, filed on May 18, 2005, which is a continuation-in-part of application No. PCT/US03/37233.

(60) Provisional application No. 60/477,391, filed on Jun. 9, 2003, provisional application No. 60/459,482, filed on Mar. 31, 2003, provisional application No. 60/455,788, filed on Mar. 18, 2003, provisional application No. 60/444,761, filed on Feb. 4, 2003, provisional application No. 60/427,737, filed on Nov. 19, 2002.

(51) Int. Cl.
*G01R 31/11* (2006.01)
*G01R 23/16* (2006.01)

(52) U.S. Cl. .......... 324/534; 324/533; 702/76; 702/124

(58) Field of Classification Search ............ 324/533, 324/534; 702/76, 124
See application file for complete search history.

(56) References Cited

U.S. PATENT DOCUMENTS 4,744,083 A    5/1988  O'Neill et al. .......... 714/204

(Continued)

FOREIGN PATENT DOCUMENTS

WO    WO 200225299    3/2002

OTHER PUBLICATIONS

Taylor F. et al., "Digital simulation of fault location on EHV lines using wideband spread spectrum techniques," Generation, Transmission and Distribution, IEE Proceeding, Jan. 1995, pp. 73-80, vol. 142, No. 1.

(Continued)

*Primary Examiner*—Walter Benson
*Assistant Examiner*—John Zhu
(74) *Attorney, Agent, or Firm*—Thorpe North & Western LLP

(57) ABSTRACT

A method of characterizing a signal path includes (i) generating a reference spread-spectrum signal; (ii) coupling the reference spread-spectrum signal into the signal path while the signal path is carrying an operational signal; (iii) receiving a reflected spread-spectrum signal from the signal path generated in response to the reference spread-spectrum signal; and (iv) correlating the reflected spread-spectrum signal with the reference spread-spectrum signal to produce a correlation result corresponding to a characteristic of the signal path.

38 Claims, 10 Drawing Sheets

U.S. PATENT DOCUMENTS

| | | |
|---|---|---|
| 4,789,948 A | 12/1988 | Von der Embse ............ 714/712 |
| 5,000,568 A | 3/1991 | Trutna, Jr. et al. ........... 356/731 |
| 5,731,993 A * | 3/1998 | Wachs et al. ................ 702/109 |
| 6,144,721 A | 11/2000 | Stephens ...................... 379/21 |
| 6,462,705 B1 | 10/2002 | McEwan ..................... 342/125 |
| 6,509,740 B1 * | 1/2003 | Needle et al. ............... 324/533 |
| 2002/0161539 A1 | 10/2002 | Jones et al. .................... 702/79 |
| 2002/0161542 A1 | 10/2002 | Jones et al. .................. 702/108 |
| 2002/0169585 A1 | 11/2002 | Jones et al. .................. 702/189 |
| 2003/0185101 A1 | 10/2003 | Wildey ........................ 361/101 |
| 2004/0019443 A1 * | 1/2004 | Jones et al. .................... 702/79 |
| 2004/0039976 A1 * | 2/2004 | Gunther et al. ............. 714/742 |

OTHER PUBLICATIONS

Taylor F. et al., "Line monitoring and fault location using spread spectrum on power line carrier" Generation, Transmission and Distribution, IEE Proceeding, Sep. 1996, pp. 427-434, vol. 143 No. 5.

* cited by examiner

METHOD AND APPARATUS FOR CHARACTERIZING A SIGNAL PATH CARRYING AN OPERATIONAL SIGNAL

CROSS-REFERENCE TO RELATED APPLICATIONS AND CLAIM OF PRIORITY

This application is a continuation-in-part of copending PCT Application No. PCT/US2004/003343 filed on 4 Feb. 2004 entitled "Method and Apparatus for Characterizing a Signal Path Carrying an Operational Signal" which claims the benefit of U.S. Application No. 60/444,761 filed on 4 Feb. 2003 entitled "Method and Apparatus for Characterizing a Signal Path Carrying an Operational Signal" and PCT Application No. PCT/US03/37233 filed on 19 Nov. 2003 entitled "Device and Method for Detecting Anomolies in a Wire and Related Sending Methods" which claims the benefit of U.S. Application No. 60/427,737 filed on 19 Nov. 2002 entitled "Handheld Device for Detecting Open, Short and Location of Anomaly on a Wire," U.S. Application No. 60/455,788 filed on 18 Mar. 2003 entitled Noise Domain Reflectometer Apparatus and Method for Determining the Integrity and/or Lengths of Signal Paths," U.S. Application No. 60/459,482 filed on 31 Mar. 2003 entitled "Mixed Signal Reflectometer Apparatus and Method for Determining the Integrity of Signal Paths," and U.S. Application No. 60/477,391 filed on 9 Jun. 2003 entitled "Method and System for Robust Multi-Carrier Spread Spectrum Data Transmission over Partially Jammed Channels."

This application is also a continuation-in-part of copending U.S. application Ser. No. 11/133,145 filed on May 18, 2005 entitled "Device and Method for Detecting Anomolies in a Wire and Related Sensing Methods" which is a continuation-in-part of PCT Application No. PCT/US03/37233.

All of the above applications are hereby incorporated by reference for all that they disclose and for all purposes.

BACKGROUND

The inventive concepts disclosed within relate generally to the testing of signal paths. More specifically, the invention relates to determining a characteristic of an electronic signal path.

The benefits of being able to test signal paths are many. Some reasons are obvious. The modern world uses electronic devices that must operate reliably. Cables (or synonymously, wires) are used as signal paths in many pieces of equipment that can have catastrophic results if the equipment fails. A good example of this is an airliner. However, the consequences of non-performance do not have to be so dire in order to see that benefits are still to be gained. infrastructure of buildings and homes, where they are difficult to reach.

Testing of wires in electronic systems can be difficult, however, as the wires are often inaccessible, hidden behind panels, wrapped in protective jackets, or otherwise difficult to access. Removal of wires for testing or inspection can cause harm, and even if the wires are functioning properly upon testing or inspection, reinsertion of the wires into the system can result in damage.

Furthermore, among the most difficult wiring problems to resolve are those involving intermittent faults. For example, vibration can cause a wire with a breach in the insulation to occasionally contact other wires or surrounding items, a so-called "dry arc fault." "Wet arc faults" occur when moisture seeps into cracked insulation, creating a conducting path for current. Because of their intermittent nature, such faults are difficult to detect. Intermittent faults can result in circuit breaker trips, particular for new smart circuit breaker technology, yet finding the source of the failure can be very difficult. Visual inspection, when possible, can fail when arc faults are too small to be detected visually.

A new type of circuit breaker, know as an arc fault circuit breaker, may actually exacerbate the challenges of detecting intermittent faults. Arc fault circuit breakers are designed to open the circuit if an arc fault is detected. Unlike conventional circuit breakers, an arc fault circuit breaker will trip even if the arc fault draws less current than the circuit breaker's maximum current rating. The goal in installing these circuit breakers is to open the circuit before damage is done to surrounding wires. But, because the circuit breaker will open before damage becomes significant, the damage can be hidden making it more difficult to detect. Also troublesome is that arc fault circuit breakers are a new technology, and may not work reliable, forcing wasted test time chasing problems that don't actually exist.

The intermittent nature of faults can be further exacerbated by differences between the typically benign environment of a service shop and the harsh realities of the operational environment. For example, in the case of an aircraft, the arc fault may only occur in the atmospheric conditions present when an aircraft is at altitude.

Finding these intermittent faults can be time consuming or even impossible using present techniques. The duration of an arc fault can be as short at 5 to 20 ms, making it virtually impossible to find using conventional testing techniques. Productive time is lost when systems must be taken out of service, yet the failures cannot be duplicated.

BRIEF SUMMARY OF THE INVENTION

It has been recognized it would be advantageous to develop a reliable, easy-to-use, cost effective, and accurate system for characterizing wires that does not require taking a system out of service in order to perform testing of a wire. By performing live testing, detection of intermittent faults is enhanced. Because the tests can be performed continuously, intermittent faults, such as open circuits, short circuits, and arc faults, can be detected and recorded when they occur, enabling maintenance to quickly identify the nature and location of intermittent wiring problems so they can be resolved A first embodiment of the present invention includes a method of characterizing a signal path. The method includes generating a reference spread-spectrum signal. The method may further include coupling the reference spread-spectrum signal into the signal path while the signal path is carrying an operational signal. The method may further include receiving a reflected spread-spectrum signal from the signal path generated in response to the reference spread-spectrum signal. The method may further include correlating the reflected spread-spectrum signal with the reference spread-spectrum signal to produce a correlation result corresponding to a characteristic of the signal path.

These and other objects, features, advantages, and alternative aspects of the present invention will become apparent to those skilled in the art from a consideration of the following detailed description taken in combination with the accompanying drawings.

DETAILED DESCRIPTION

Figure 1:
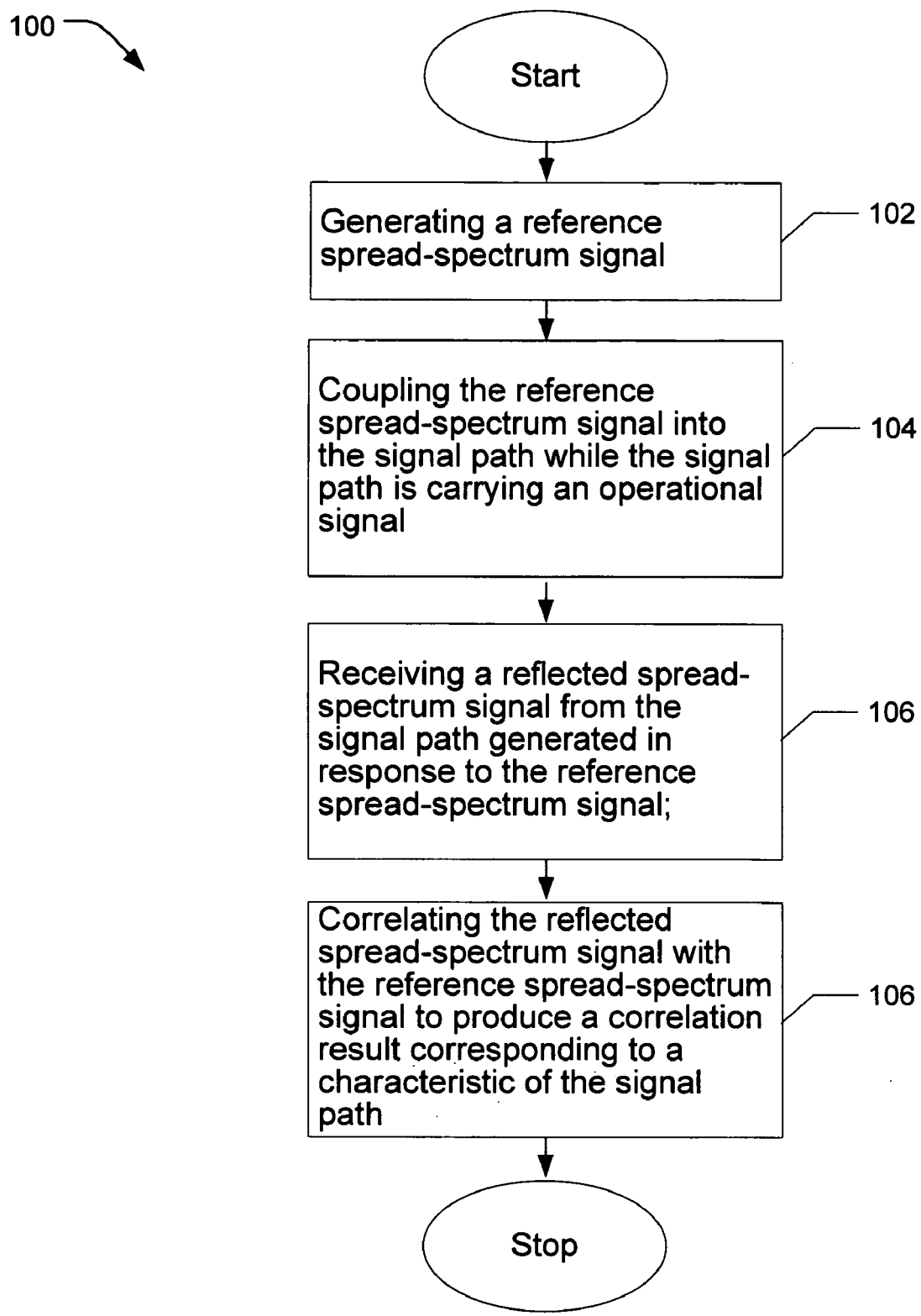
FIG. 1 is a block diagram of a method of characterizing a signal path in accordance with an embodiment of the present invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

It is to be understood that, although this description is focused on one particular exemplary application, the testing of a wire, various other applications of the inventive principles described herein are also possible some of which are discussed in further detail below. In general, distance measurement, length measurement, and impedance measurement may all be accomplished through the inventive techniques disclosed within. There are many applications to which these three characteristics can be applied. Distance measurements have important applications in manufacturing control of robotic vehicles, and in the monitoring of reservoirs of various materials such as water, fuel, food, etc. Impedance measurements may be used to distinguish materials from each other. Likewise, length measurements have already been shown to have important applications in the testing of aging wiring in various structures including planes, trains, automobiles, ships, all types of electrical machinery, etc. Finally, impedance measurements may also be used in the above-mentioned applications and for the direct characterization of electrical systems, including wiring and antennas.

In particular, embodiments of the present invention may be applied to perform impedance measurements when environmental noise or other signals are present on test wires, sensors, etc. For example, these sensing applications include testing for soil moisture, water level, fluid discrimination, proximity sensing, etc. Embodiments of the invention may also provide a more robust measurement.

The terms "wire," "cable," and "signal path" and are used interchangeably herein. Although "signal path" is used principally to refer to a wired signal path, it is to be understood that the disclosed inventive concepts may equally be applied to a wireless signal path. The terms "anomaly," "fault," "discontinuity," and "problem" are also used interchangeably herein.

A method 100 of characterizing a signal path is illustrated in FIG. 1 in accordance with an embodiment of the present invention. Signal paths are typically wires, wire bundles, twisted pair cables, shielded cables, coaxial cables, transmission lines, and the like. The method may also, however, be applied to testing of wireless signal paths, for applications such as range finding and distance measurement. Characteristics of a signal path may include wire length, impedance (characterized as open circuits and short circuits), the location of the open and short circuits, including intermittent opens and shorts, connection location, capacitance, inductance, resistance, and identifying and locating other anomalies on the wire, including chafes, frays, corrosion, and fluid bridging, that may be indicative of damage.

The method 100 includes generating 102 a reference spread-spectrum signal. A spread-spectrum signal includes a pseudo-noise code, a modulated pseudo-noise code, or a pulse-shaped pseudo-noise code. Various techniques to generate a spread-spectrum signal are known to one skilled in the art. For example, one technique is to change the spread-spectrum signal frequency according to a known pattern based on a code; this technique is known as frequency hopping spread-spectrum (FHSS). The code determines the order in which a set of predetermined frequencies (the hopset) is used. Another technique is to use a pseudorandom sequence (sometimes called PN sequence or PN code). The PN sequence may be used to modulate the phase or amplitude of a carrier frequency; this technique is known as direct sequence spread-spectrum (DSSS). Each bit of a PN sequence is known as a chip. What is salient with either approach is that the resulting spread-spectrum signal may be generated with a wide bandwidth based on the rate of frequency hopping or the chip rate of the PN sequence. The resolution of the system is related to the hop rate (for FHSS) or the chip rate (for DSSS). Because of this, DSSS is presently preferred as it is generally less complex to implement for high chip rates. For example, a chip rate of about 30 MHz or greater may provide resolution of about one-third meter. Higher resolution may be provided with higher chip rates.

The method 100 further includes the step of coupling 104 the reference spread-spectrum signal into the signal path while the signal path is carrying an operational signal. It is known in the art that spread-spectrum signals may be used to reduce the effect of interference in communications systems. This aspect of the method will be discussed in further detail below. Coupling the reference spread-spectrum into the signal path may be performed in various ways. For example, the reference spread-spectrum signal may be coupled into the signal path by directly electrically connecting to the signal path. Alternately, the spread-spectrum signal may be coupled into the signal path indirectly by inductive or capacitive coupling.

The method 100 further includes receiving 106 a reflected spread-spectrum signal from the signal path. The reflected spread-spectrum signal may be received from the same point on the signal path where the reference spread-spectrum signal is coupled into the signal path or may be received from a different point.

The reflected spread-spectrum signal may be generated in response to the reference spread-spectrum signal. As is known in the art, any impedance discontinuity in the wire will cause a reflection. The impedance of a wire is effected by the characteristics of the wire (e.g., shape, size, material, etc.), and the environment surrounding the wire (e.g., insulation, dielectrics, coatings, nearby metal, etc.) Hence, an impedance discontinuity may be caused, for example, by a defect in the wire (e.g., a breach, nick, or cut in the wire, insulation, or dielectric). Similarly, an impedance discontinuity may be the result of a splice between two wires, a connection node with multiple wires, a connector, a poor connection, a bend in the wire, a termination of the wire, or the end of the wire.

The reflected spread-spectrum signal will be reflected with an amplitude (and phase) proportional to the impedance discontinuity. The reflected spread-spectrum signal will travel back along the signal path, and hence will be offset in time relative to the reference spread-spectrum signal. This offset in time will be proportional to the propagation velocity in the signal path and the distance traveled. The distance traveled is from the point the reference spread-spectrum signal is coupled into the signal path to the impedance discontinuity plus the distance from impedance discontinuity to the point the reflected spread-spectrum-signal is received from the signal path.

The method 100 further includes correlating 108 the reflected spread-spectrum signal with the reference spread-spectrum signal to produce a correlation result. The correlation result corresponds to a characteristic of the signal path.

For example, correlation may be performed for a variety of different relative time shifts between the reference spread-spectrum signal and the reflected spread-spectrum signal. As will be recognized by one skilled in the art, this correlation result will have a peak corresponding to the delay difference between the reference spread-spectrum signal and reflected spread-spectrum signal. Furthermore, this peak will be proportional to the magnitude of the impedance discontinuity. The correlation result is similar to the response received from a time domain reflectometer, and thus can be interpreted by one skilled in the art in an similar manner. For example, a signal path which is normally terminated with a matched impedance may normally generate a very small reflected spread-spectrum signal, and hence a very small correlation result. Hence, a large correlation result may provide a direct indication of a fault on such a signal path.

The correlation result may be complicated by multiple impedance discontinuities. Many types of wire and cable are designed specifically to have controlled impedance; for example, 75-ohm coaxial cable or 70-ohm shielded twisted pair cable. Some types of cable, though not specifically designed for controlled impedance, have roughly constant impedance along their length. For example, single isolated wires, twisted pairs, and multi-conductor cables have been observed with this property. Other types of cable have inconsistent impedance along their length. When there are multiple impedance discontinuities along the length of the cable, multiple reflections will occur, resulting in a more complex correlation result. The multiple reflections can be sorted out in a similar manner as used for time domain reflectometry, for example using computer pattern matching and analysis.

There are many benefits to performing live testing, only a few of which will be described here. One benefit is the ability to detect intermittent faults. Consider, for example, an arc fault situation cause by a small break in the insulation of a wire. The arc fault may only occur occasionally, and only when there is a sufficiently high voltage on the wire, such as at the peaks of an alternating current waveform. Off-line testing (when there is no operational signal present) may have difficulty detecting the small impedance mismatch presented by the small break in the insulation. When an operational signal is present, however, during the few milliseconds the arc fault is active, the intermittent fault is a significant impedance mismatch, rather than the tiny mismatch observed when it is inactive. Hence, by performing testing while there is an operational signal present, the intermittent fault just described can be detected.

Spread-spectrum sensing provides several advantages over time domain reflectometry (TDR). As noted above, spread-spectrum signals are known in the communications art for their ability to enable the rejection of interference. Spread-spectrum signals may be generated which have low power and wide bandwidth such that they may be superimposed on top of an operational signal so that the cable can be tested while in use without disrupting the operation of an operational signal. Similarly, the interference rejection property of spread-spectrum signals may also be used advantageously to permit testing while an operational signal is present without the operational signal disrupting the test results. Spread-spectrum signals can be generated which provide excellent interference rejection for a wire range of operational signal types, reducing the need to know details of the operational signal characteristic. In contrast, live testing is difficult or impossible to accomplish with conventional time domain reflectometry, frequency domain reflectometry, or standing wave reflectometry signals.

The generating 102 the reference spread-spectrum signal will now be discussed further. In another embodiment of the present invention, the method may also include adapting the reference spread-spectrum signal so that the operational signal is substantially unaffected by the spread-spectrum signal. Selecting an appropriate format for the reference spread-spectrum signal, as discussed further, may ensure that the operational signal is substantially unaffected. Alternately, testing the performance of the system when the reference spread-spectrum signal is present may be performed to verify that the operational signal is substantially unaffected, and adjustments in the operational signal made if necessary. For example, the system may be substantially unaffected when it continues to operate normally, minimal interference is caused to the operational signal, operation of the system continues within specifications, or operation of the system is degraded slightly to an unobjectionable extent.

Various alternatives exist for the format of the spread-spectrum signal. In one embodiment, the reference spread-spectrum signal level may be set below a noise threshold of the operation. This noise threshold may correspond to a maximum level of tolerable noise for the system. For example, a standard aircraft communication data bus is Mil-Std-1553. Mil-Std-1553 operates with a 1 Mbit/second data rate with a voltage of up to 20 V peak to peak. Mil-Std-1553 allows for a signal to noise ration of 17.5 dB. Hence, by maintaining the level of the spread-spectrum reference signal at least 17.5 dB below the level of an operational signal conforming to Mil-Std-1553, interference to the operational signal is reduced. Of course, even lower reference spread-spectrum signal levels may result in less interference. On the other hand, if the reference spread-spectrum signal level is set too small, sensitivity of the system may be compromised. Setting of the reference spread-spectrum signal level may thus depend on the characteristics of the operational signal, signal path, and desired sensitivity.

Figure 2:
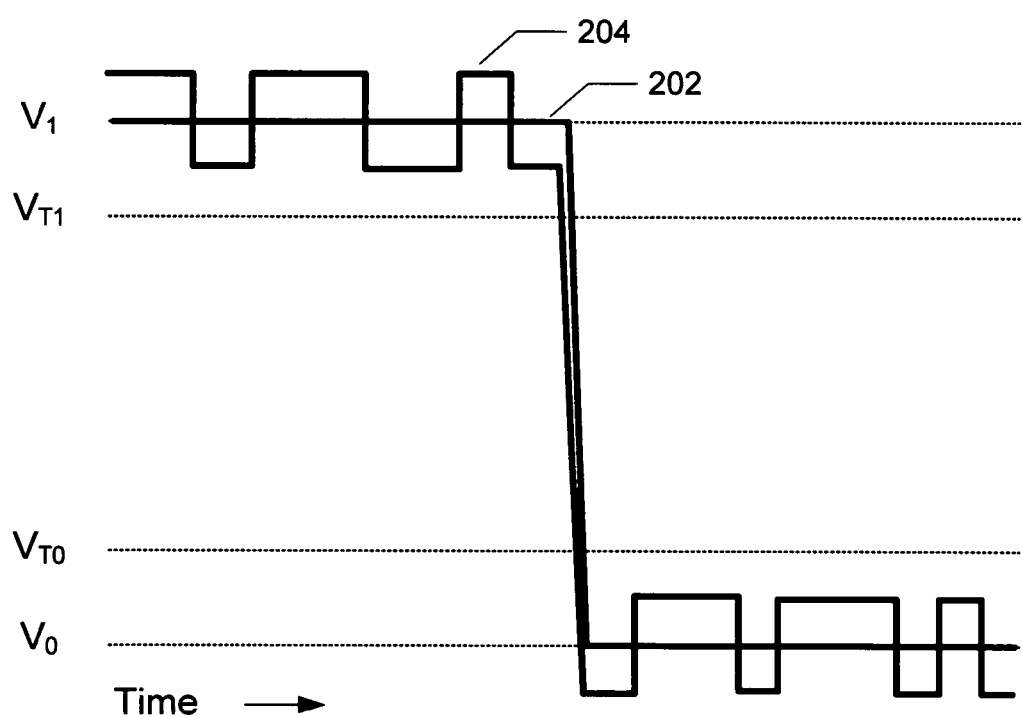
FIG. 2 is an illustration how a level of the reference spread-spectrum signal level may be set below a noise threshold of the operational signal in accordance with an embodiment of the present.

Other types of operational signals may have their own unique requirements. For example, FIG. 2 is an illustration how a level of the reference spread-spectrum signal level may be set below a noise threshold of a digital operational signal in accordance with an embodiment of the present. In FIG. 2, the nominal voltages for the digital signal are shown, where $V_1$ is the voltage for a logical "1" and $V_2$ is the voltage for a logical "0". $V_{T1}$ and $V_{T0}$ are the corresponding threshold voltages. The digital logic will treat any voltage above $V_{T1}$ as a logical "1" and any voltage below $V_{T0}$ as a logical "0." The difference between the $V_0$ and $V_{T0}$ (and between $V_1$ and $V_{T1}$) are sometimes called the noise threshold or noise margin. The logic high noise margin (difference between $V_1$ and $V_{T1}$) and the logic low noise margin (difference between $V_0$ and $V_{T0}$) may be different. FIG. 2 illustrates the operational signal 202 and operational signal with the reference spread-spectrum signal 204 superimposed on top. As can be seen, if the voltage of the reference spread-spectrum signal is less than the noise threshold, the operational signal will be substantially unaffected.

For some types of signals, some minor effects (such as occasional errors or slight distortion) may be acceptable during operation, and thus are included within the meaning of substantially unaffected. For example, a small change in the error rate or a digital signal, or slight distortion in an analog signal maybe acceptable.

The direct sequence spread-spectrum signal may be generated by translating a baseband pseudo-noise sequence by a frequency offset to produce the reference spread-spectrum signal in accordance with another embodiment of the present invention. This translation may be performed by modulating the PN sequence onto a carrier frequency at the frequency offset desired. A binary pseudo-noise (PN) sequence consisting of a series of +1 and −1 may be used, although non-binary sequences are known in the art and are to be considered within the scope of the present invention. Various methods for generating PN sequences are known in the art, including linear feedback shift registers. Typically, PN sequences have a finite length, and may repeat every N chips.

In a communication system, the PN sequence is modulated (or multiplied) by data, and then modulated by a carrier signal at a carrier frequency to shift and center the spectrum of the PN sequence around the carrier frequency. For example, this modulation may be performed using binary or quadrature phase shift keying, or various other modulation formats known in the art which are to be considered within the scope of the invention. For communications systems, the chip rate is generally much higher than the data rate, resulting in a spread-spectrum signal bandwidth much wider than the bandwidth corresponding to the data. The higher the chip rate, and thus bandwidth, that is used, more interference resistance is generally obtained.

The inclusion of data is not essential for the applications described within, although data may optionally be included as discussed further below.

By shifting the reference spread-spectrum signal, improved performance may be obtained. For example, if the operational signal is at a low frequency, by shifting the reference spread-spectrum to a higher frequency, less interference may result. On the other hand, if the carrier frequency is set too high, dispersive propagation may occur in the signal path which may reduce accuracy. By setting the carrier frequency so that the wavelength is much larger than the expected separation of the wire from the surrounding environment, such dispersive effects may be minimized. Other factors, for example attenuation or bandwidth limitations in the signal path, may also set an upper limit on the frequency which may be used.

The direct sequence spread-spectrum signal may be generated by shaping the spectrum of the reference spread-spectrum in accordance with another embodiment of the present invention. This may result in improved performance. For example, by coupling less reference spread-spectrum signal energy into the signal path at frequencies where the operational signal has high energy, less interference may result.

Various methods of correlating signals are known in the art. Correlation of a binary pseudo-noise sequence may be performed by multiplying the two sequences together on a chip by chip basis, and then summing (or integrating) the resulting products. When the two sequences are aligned with the same time-reference, the pseudorandom signals cancel each other out, resulting in a constant output (plus any noise, operational signal, or other pseudorandom signals with different time-references). Alternately, the sequences may be multiplied together and then a low pass filtering operation performed. Better accuracy using integration may be obtained than using low pass filtering. The number of chips for which the correlation is summed or filtered may conveniently be set equal to the length of the PN sequence, although this is not essential.

Correlation of a spread-spectrum signal at a carrier frequency may be performed by mixing the spread-spectrum signal down to baseband, and then performing the above-described correlation. Although it is preferable that the mixing is performed using a local oscillator synchronized to the carrier frequency, this is not essential, as methods of tracking out or compensating for phase and frequency drift between two oscillators are known in the art.

It should be noted that the correlation process may also result in a reduction in interference from the operational signal. Any noise or operational signal that may be superimposed on the reflected spread-spectrum signal will also be multiplied by the PN sequence during the correlation. This multiplication has the effect of spreading the spectrum of noise or operational signal superimposed on the reflected spread-spectrum signal, which is then filtered out in the following low pass filtering or integration process. Consequently, by choosing a chip rate much greater than data rate of the operational signal, interference from the operational signal may be reduced. Higher chip rates also provide benefit in improving the resolution with which the location of impedance discontinuities can be located. Similarly, longer correlation lengths (summing more product terms or lower bandwidth low pass filtering) can also filter out more noise or operational signal.

The embodiments of the invention disclosed may provide several advantages over time domain reflectometry (TDR). TDR is limited in the energy which is transmitted in a single pulse. This energy limitation limits the sensitivity of TDR. Using higher pulses can provide higher sensitivity. Since the TDR pulse must be narrow to provide good resolution, however, the energy that the TDR system can put into the signal-path is severely constrained by voltage constraints of the TDR system and signal-path. If the signal path is lossy, the performance of TDR is even further degraded.

Limitations of TDR may be mitigated in an embodiment of the present invention by using PN sequences. Since the resolution is a function of the chip rate, and the signal to noise ratio is a function of the PN sequence length, the resolution and sensitivity may be selected independently. The longer the time for which correlation is performed, the more energy that is coherently combined. Hence, high sensitivity may be obtained by using long correlation times (and correspondingly long PN codes).

In correlating the reference spread-spectrum signal with the reflected spread-spectrum signal, it is useful to time-offset the reference spread-spectrum signal. The correlating may be performed for one particular time-offset or several different time-offsets. Various ways of shifting the time-offset, or time-reference, of the reference spread-spectrum signal are known, including delaying the reference spread-spectrum signal, changing the frequency of a clock generating the reference spread-spectrum signal generator, or controlling the start time of a pseudonoise generator used in generating the reference spread-spectrum signal.

By correlating at several different time-offsets, a plot of the response of the signal path similar to what may be observed with a time-domain reflectometer may be produced. Alternately, correlating at one particular time-offset may allow observation of dynamic changes in a particular impedance discontinuity (perhaps corresponding to an arc fault or other anomaly in the signal path).

Correlating the reflected signal with the reference spread-spectrum signal may be performed by shifting a time-reference of the reference spread-spectrum signal in increments of less than a chip-time in accordance with another embodiment of the present invention. This may provide improved resolution.

Optionally, the method may include processing the correlation result to determine the characteristic of the signal path in accordance with another embodiment of the invention. For example, based on the time-offset between the reference spread-spectrum signal and reflected spread-spectrum signal at which the correlation result has a peak, the distance to an impedance discontinuity can be found. Based on the phase and amplitude of the correlation result corresponding to the peak, various characteristics of the impedance discontinuity can also be determined. Techniques for processing are discussed in further detail below.

Optionally, the processing may also include adjusting a system operation based on a characteristic of the signal path. For example, a characteristic of the signal path may indicate a fault condition (e.g. a short or open circuit) that may cause damage if allowed to persist, in which case a circuit breaker or crowbar circuit may be triggered. Alternately, a system may be designed to adjust operation depending on a changing impedance characteristic of the signal path, for example automatically matching a changing impedance load to the system. The live detection of signal path characteristic changes enabled by the method may have many other uses which are to be considered within the scope of the invention.

Figure 3:
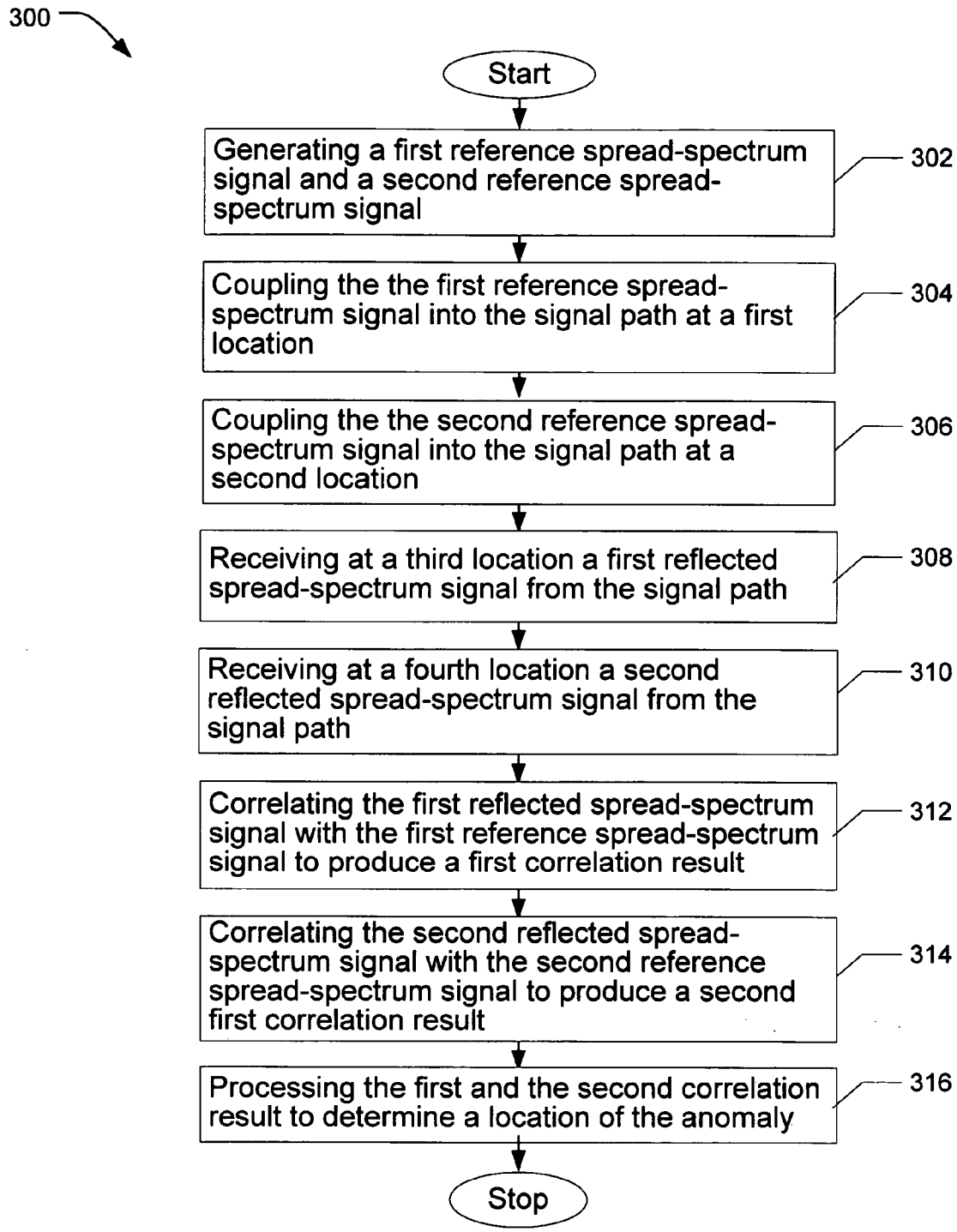
FIG. 3 is a block diagram of a method of testing a signal path having an anomaly in accordance with an embodiment of the present invention.

A method 300 of testing a signal path having an anomaly is illustrated in FIG. 3 in accordance with another embodiment of the present invention. The method may include generating 302 a first reference spread-spectrum signal and a second reference spread-spectrum signal. The method may further include coupling 304 the first spread-spectrum signal into the signal path at a first location while the signal path is carrying an operational signal. The method may further include coupling 306 the second spread-spectrum signal into the signal path at a second location different than the first location while the signal path is carrying the operational signal. The method may further include receiving 308 at a third location a first reflected spread-spectrum signal from the signal path generated by the anomaly in response to the first and second spread-spectrum signals. The method may further include receiving 310 at a fourth location a second reflected spread-spectrum signal from the signal path generated by the anomaly in response to the first and second spread-spectrum signals. The method may further include correlating 312 the first reflected spread-spectrum signal with the first reference spread-spectrum signal to produce a first correlation result. The method may further include correlating 314 the second reflected spread-spectrum signal with the second reference spread-spectrum signal to produce a second correlation result. The method may further include processing 316 the first and second correlation result to determine a location of the anomaly in the signal path.

Figure 4:
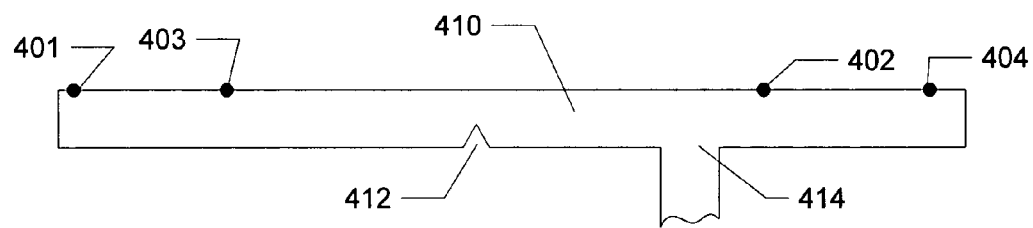
FIG. 4 is an example application of the method in accordance with an embodiment of the present invention.

In order to understand the method 300 better, reference will be made to an example application of the method as illustrated in FIG. 4, although the method is not limited to this example. A signal path is illustrated in FIG. 4 in the form of a wire 410. The wire may have an anomaly 412. When the first reference spread-spectrum signal is injected at the first location 401, it will travel down the wire, and a portion of the reference spread-spectrum signal will be reflected back toward location 1. A portion of the reference spread-spectrum signal will continue to travel down the wire (unless, for example, the anomaly is an open or short circuit). This portion of the reference spread-spectrum signal may reflect off of other anomalies as will be discussed further below. The reflected spread-spectrum signal will arrive back at third location 403 after a time-delay. The time-delay will be the time it takes for the signal to propagate from the first location 401 to the anomaly and back to the third location 403. The corresponding distance can be found by multiplying the time-delay by the propagation velocity in the signal path. If the distance from the first location to the third location is known (or determined as discussed below) it can be subtracted out, and the distance to the anomaly found.

The distance between the first location 401 and third location 403 may be determined by measuring the delay between these locations similarly as to how delay is measured between the reference spread-spectrum signal and reflected spread-spectrum signal. In fact, distance between any two points in the signal path can be measured in this manner.

Similarly, when the second reference spread-spectrum signal is injected at the second location 402, the second reference spread-spectrum signal will travel along the signal path, and a portion reflected back towards the fourth location 404 by the anomaly 412. Hence, the distance from the second location to the anomaly to the fourth location can be determined.

Various advantages of the method 300 may now be described. One advantage is that improved accuracy may be obtained in determining the location of the anomaly by combining the distance measurements. For example, some uncertainty in the distance measurement is caused by uncertainty concerning the propagation velocity in the wire and noise. Distance measurements from the different locations on the wire to the anomaly may have different errors, and thus can be averaged to improve accuracy. Similarly, the actual propagation velocity in the wire may be measured by measuring the delay between known distances.

Another advantage of the method 300 is that it may be possible to sort out multiple reflections which occur due to multiple anomalies, multiple connections, or multiple reflections. For example, the first reference spread-spectrum signal injected at the first location 401 may be reflected from the anomaly 412, and a portion may continue on down the wire to reflected from a wire junction 414 or even from the other end of the wire at the second location 402. All of these reflections will propagate back toward the third location 403 and result in multiple peaks in the correlation response. Hence, it can prove difficult to sort out correlation peaks indicative of an anomaly from those indicative of a normal connection or wire end. For the second reference spread-spectrum signal, a second set of reflections will occur, but because the second reference spread-spectrum signal is injected at a different location, the delays will be different those for the first reference spread-spectrum signal. Hence, by combining the correlation result obtained at both the third location and fourth location, it may be possible to sort out the multiple correlation peaks.

Yet another advantage of the method is apparent when there is a short or open circuit which prevents the first (or second) reference spread-spectrum signal from propagating past the anomaly. If there are multiple anomalies in the wire, only the first anomaly can be detected from one end; by testing from each end, multiple anomalies can be detected. In such a case, of course, the first (or second) reflected spread-spectrum signal will depend on only one of first or second reference spread-spectrum signals.

It is to be understood that, although this description has assumed the first location differs from the third location, this is not required. The first location 401 may be identical to the third location 403, and similarly the second location 402 may be identical to the fourth location 404.

In another embodiment of the present invention the method may further include embedding the first correlation result in the first reference spread-spectrum signal and communicating the first correlation result from the first location to the fourth location. In yet another embodiment of the present invention the method may further include embedding the second correlation result in the second reference spread-spectrum signal and communicating the second correlation result from the second location to the third location.

Embedding the correlation result in the first (or second) reference spread-spectrum signal may be accomplished by modulating the first (or second) correlation result as data onto the reference spread-spectrum signal. There are many ways this can be accomplished as will occur to one of skill in the art. By communicating the first (or second) correlation from the first (or second) location to the third (or fourth) location, various advantages may be obtained. For example, processing may be performed at only the third (or fourth) location permitting a simplification in the electronics. Conversely, even if processing is included at both the third and fourth locations, communication of the correlation result (or a processed version of the correlation result) may simplify communicating or displaying the location of the anomaly. Yet another advantage is the redundancy provided by testing from either end of the wire. Finally, yet another advantage is a wire breaks may also be detected, for example by noting the loss of the reference spread-spectrum signal from the other end of the wire.

Figure 5:
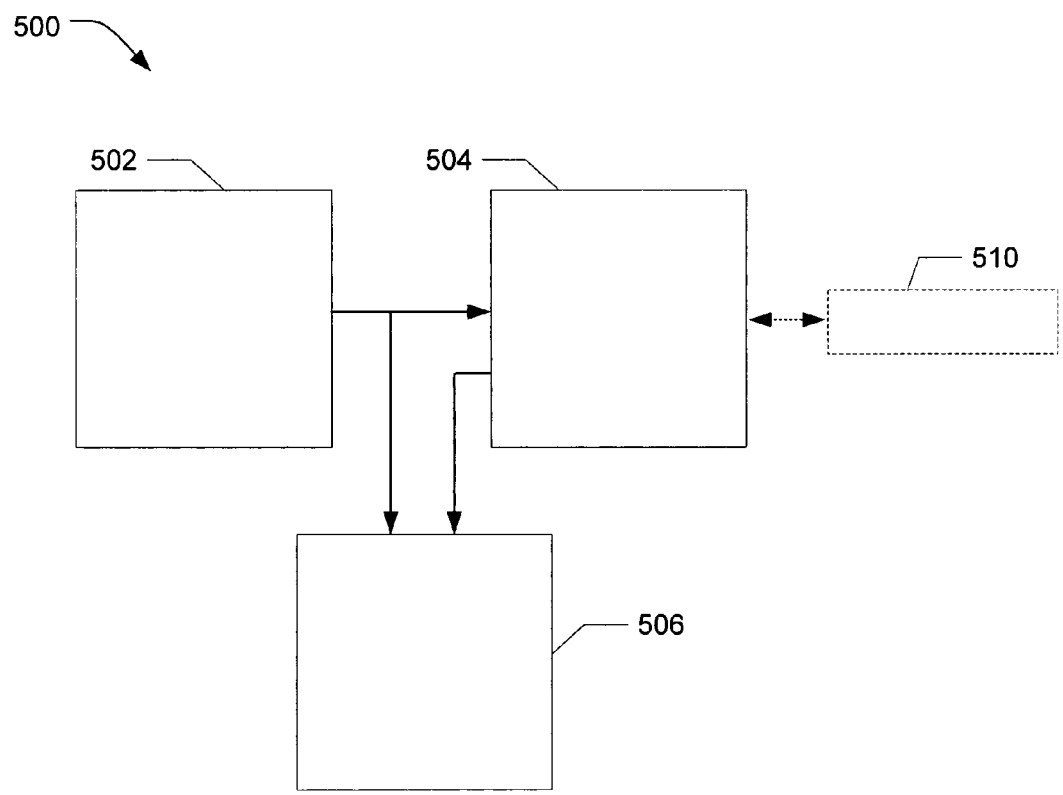
FIG. 5 is a block diagram of a system for characterizing a signal path carrying an operational signal in accordance with an embodiment of the present invention.

A system 500 for characterizing a signal path carrying an operational signal is illustrated in FIG. 5 in accordance with an embodiment of the present invention. The system can be referred to as a spread spectrum reflectometer. The system may include a signal generator 502 configured to generate a reference spread-spectrum signal. The reference spread-spectrum signal may be adapted so that when applied to the signal path the operational signal is substantially unaffected. The system may further include an interface 504 coupled to the signal generator and configured to inject the reference spread-spectrum signal into the signal path 510. The interface may be configured to extract a reflected spread-spectrum signal from the signal path generated in response to the reference spread-spectrum signal. The system may further include a corrector 506 coupled to the signal generator and coupled to the interface and configured to correlate the reflected spread-spectrum signal with the reference spread-spectrum signal to produce a correlation result. This correlation result may correspond to a characteristic of the signal path. Characteristics of a signal path may include wire length, impedance (characterized as open circuits and short circuits), the location of the open and short circuits, including intermittent opens and shorts, connection location, capacitance, inductance, resistance, and identifying and locating other anomalies on the wire, including chafes, frays, corrosion, and fluid bridging, that may be indicative of damage.

Various spread-spectrum signal generators are known in the art. For example, in one embodiment, the spread-spectrum signal generator may be configured to produce a reference spread-spectrum signal that has a signal level below a noise threshold of the operational signal. In another embodiment, the spread-spectrum signal generator may be configured to generate a reference spread-spectrum signal has a bandwidth much greater than a bandwidth of the operational signal.

Figure 6:
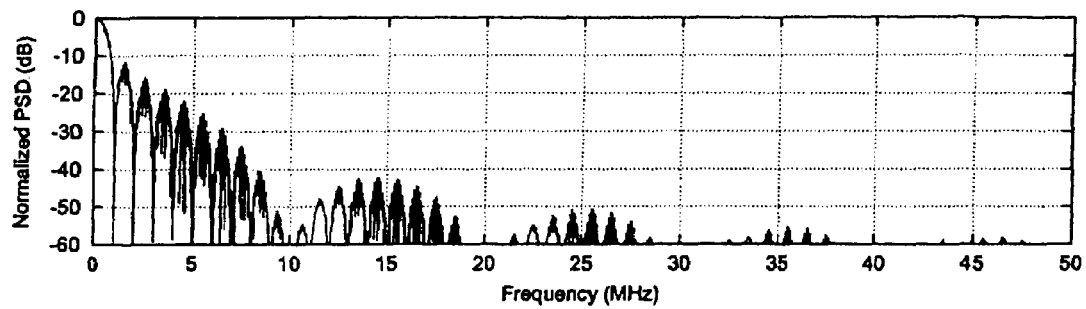
FIG. 6 is an illustration of the frequency spectrum of a simulated Mil-Std 1553 signal.

For example, FIG. 6 is an illustration of the frequency spectrum of a simulated Mil-Std 1553 signal. As can be seen, the power spectrum of a Mil-Std 1553 signal drops off significantly above about 5 to 10 MHz. Hence, by setting the bandwidth of the spread-spectrum signal to several times this, for example 120 MHz, interference to the operational system signal can be reduced. Similarly, by shifting the carrier (center) frequency of the spread-spectrum signal to 50 MHz or so, interference is further reduced.

In yet another embodiment, the spectrum of the reference spread-spectrum signal may be shaped to substantially inversely mirror the spectrum of the operational signal. For example, the reference spread-spectrum signal spectrum may be shaped to concentrate the power of the reference spread-spectrum signal in frequency bands where the spectrum of the operational signal is small.

For example, the spread-spectrum signal may be frequency shifted into a frequency band different from that used by the operational signal to reduce potential interference or disruption of the system operation. Conversely, such shifting may be used to shift the reference spread-spectrum signal into a frequency band corresponding to a range of frequencies that the signal path permits to propagate.

For example, with a Mil-Std 1553 signal, the spectrum of the reference spread-spectrum signal may be set lower (relative to an unshaped spectrum) in the frequency range below 10 MHz, and higher in the frequency range above 30 MHz. Conversely, if the spectrum of the operational signal is mostly in a higher frequency band (for example 100 MHz), the spectrum of the reference spread-spectrum signal may be set to be primarily below this frequency (for example, using a baseband PN sequence with no frequency offset).

The signal generator 502 may be implemented by using a PN sequence generator. Various PN sequences and PN sequence generators are known in the art. Known PN sequences include Walsh Codes, Barker Codes, Gold Colds, and Kasami codes. Known PN generators include linear recursive sequence generators, tapped feedback shift registers, and fixed memories. A PN generator may be implemented in hardware using a combination of gates and delay elements, or may be implemented in software. Although a hardware implementation is presently preferred in order to provide high (many MHz) PN clock rates to yield high resolution distance measurements, some applications may be able to use lower PN clock rates and a software implementation of the PN generator.

The performance of a PN code in the applications described herein relates to the auto-correlation and cross-correlation of the code. PN codes that have a high correlation peak at zero delay relative to the correlation for non-zero delays are presently preferred. The cross-correlation of two different PN codes relates to the performance of PN codes used for communications, and generally low cross-correlation is preferred in communications applications. When multiple reference spread-spectrum signals are coupled into the signal path, using sets of PN codes with low cross-correlation is advantageous.

A combination of two codes may also be used to advantage. For example, by combining a Walsh code (which has excellent cross correlation properties for some time delays) with another PN code (which has excellent auto correlation for time shifts), improved performance may be obtained.

In selecting a particular code to be used, the following observations have been made. Maximum length codes typically have a very small off-peak correlation value and thus may be advantageous when only a single reference spread-spectrum signal is used at a time. Kasami codes have very low off-peak auto-correlation and cross-correlation and thus may be advantageous when multiple reference spread-spectrum signals are used. The number of Kasami codes are limited, however, and if a large number of simultaneous signals are to be used, Gold codes may prove advantageous.

Various options for the interface 504 also exist. In one embodiment of the invention, the interface may include an isolator. An isolator provides isolation between the signal generator 502 and the signal path 510, reducing the likelihood of damage to the signal generator from a high-voltage operational signal. Various types of isolators are known in the art, including capacitors, inductors, circulators, and directional couplers. For example, two directional couplers may be combined to allow separate injection and extraction of the reference spread-spectrum signal and reflected spread-spectrum signal, however separation of the signals is not essential. The interface may also be configured to impedance match the signal path to minimize reflections occurring at the point the reference spread-spectrum signal is injected.

It should be noted that the reference spread-spectrum signal need not be coupled into the signal path at the same location from which the reflected spread-spectrum signal is extracted.

The interface 504 may also be quite simple, consisting of little more than a connector, probe, wire connection, or antenna.

Various ways to implement the correlator 506 are known in the art. For example, correlation may be performed using a matched filter, finite impulse response (FIR) filter, or surface acoustic wave (SAW) device. Correlation may be performed in a digital or analog format. Analog correlation may prove superior because of the higher dynamic range generally provided by analog processing. Correlation may be performed sequentially (computing a correlation result at one time-offset at a time) or in parallel (computing multiple correlation results simultaneously). The correlation may be performed for a single or multiple time offsets as discussed above. For example, a correlator may be implemented in digital logic using a field programmable gate array or application specific integrated circuit. Correlation may be performed using one-bit samples of the signal, or multiple-bit samples to provide higher accuracy. Correlation may also be performed by differentially amplifying a delayed and undelayed version of the signal.

In particular, in accordance with another embodiment of the present invention, correlation may be performed for multiple time offsets in parallel using a bank of correlators. By performing multiple correlations in parallel, improved performance in detecting short duration intermittent faults may be obtained. For example, an intermittent fault may last for only a single or a few cycles of the operational signal (e.g. when the operational signal is at a voltage peak). If correlation is performed too infrequently at the time-offset corresponding to the distance of the failures (anomaly), detection of the intermitted may not occur. Hence, performing multiple correlation in parallel may allow increased speed and consistency in detecting of intermittent faults.

In another embodiment of the present invention, the correlator may be further configured to suppress interference from the operational signal. Spread-spectrum signals, both baseband and modulated (frequency shifted) are detectable through correlation even though they may be buried in noise. The ability to pick out the signal is due to processing gain, which for Direct Sequence Spread-spectrum (DSSS) can be expressed as $$PG = \frac{T_s}{T_c} = \frac{R_c}{R_s} = \frac{W_{ss}}{2R_s}$$

where $W_{ss}$ is the bandwidth of the spread-spectrum signal, $T_s$ is the duration of one entire PN sequence (considering the entire sequence equal to one bit of data in communication-system terms), $T_c$ is the duration of a PN Code chip, $R_c$ is the chip rate in chips per second, and $R_s$ is the symbol rate of the number of full sequences per second. By setting this processing gain to a required level, interfering operational signals (for example, a 400 Hz 115V AC or digital data on the wires) can be suppressed.

Figure 7:
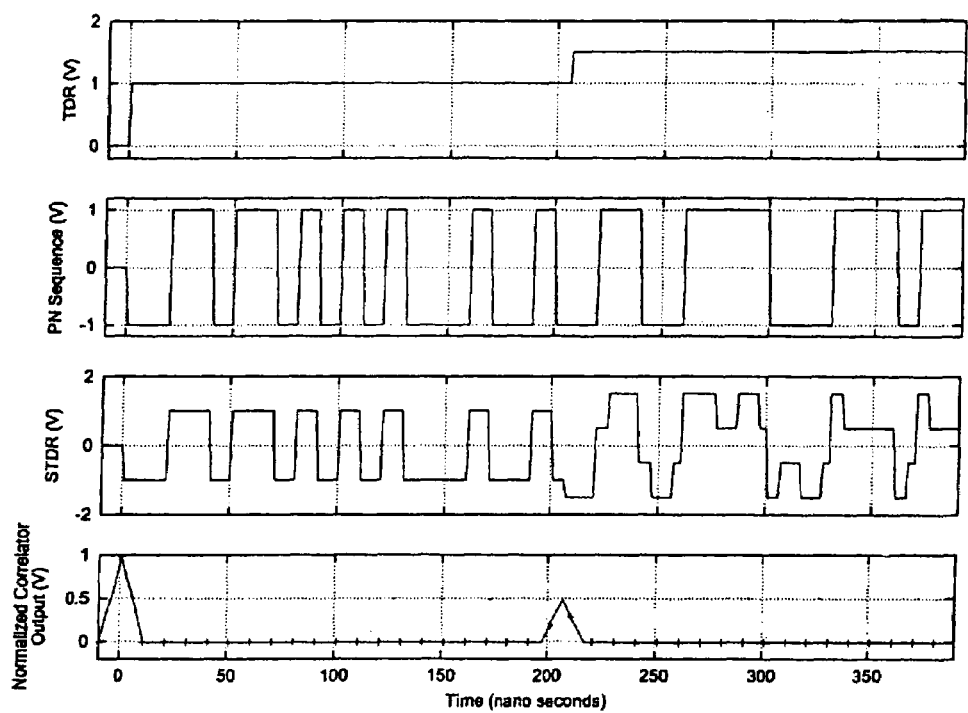
FIG. 7 is an illustration of the signals obtained in baseband sequence time domain reflectometry (STDR) in accordance with an embodiment the present invention.

The correlator may compute the correlation result for various time offsets. FIG. 7 is an illustration of the signals obtained in baseband sequence time domain reflectometry (STDR) in accordance with an embodiment of the present invention. For comparison, a TDR example is shown in the top plot. The PN sequence is the injected reference spread-spectrum signal. The STDR plot shows the reflected spread-spectrum signal superimposed on the reference spread-spectrum signal. The correlation result is shown in the bottom plot. The '+' marks show the data that may be collected if the system only computed the correlation result at full chip-time time-offsets. As can be seen, improved performance in locating impedance discontinuities may be obtained by computing the correlation result at time-offsets of less than chip-time. Accordingly, an embodiment of the present invention includes wherein the correlator is further configured to generate the correlation result for a time-offset of less than a chip-time.

Figure 8:
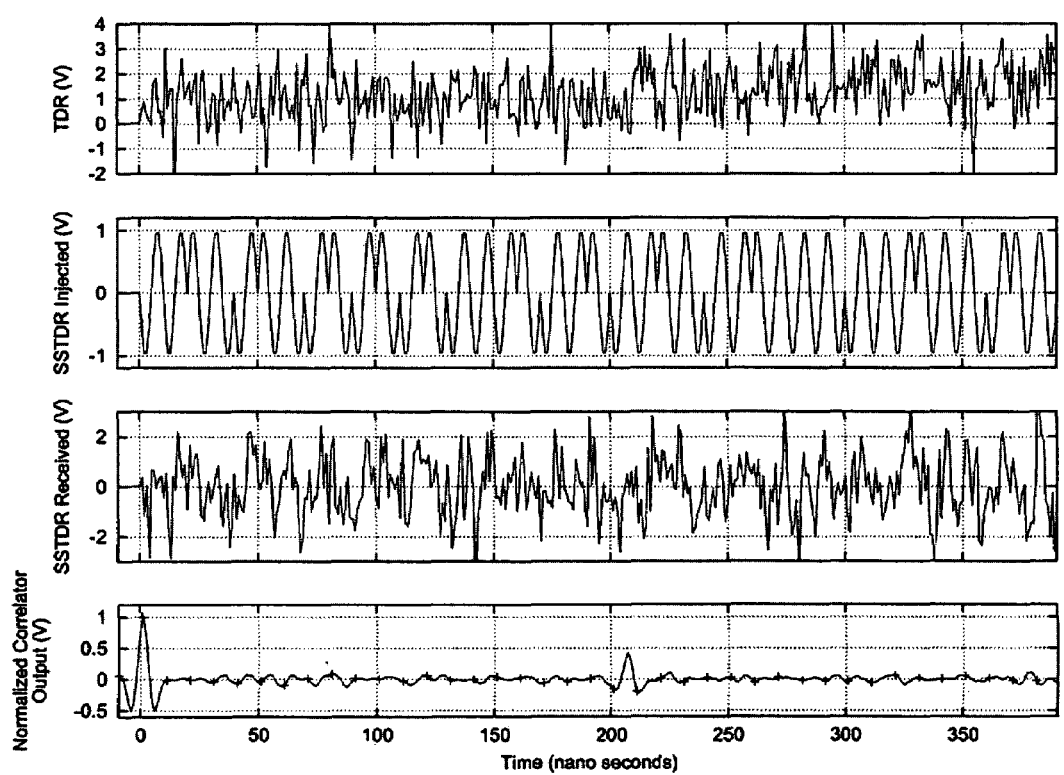
FIG. 8 is an illustration of the signal obtained in a spread-spectrum time domain reflectometer (SSTDR) in accordance with an embodiment of the present invention.

FIG. 8 is a similar illustration of the signal obtained in a spread-spectrum time domain reflectometer (SSTDR) in accordance with an embodiment of the present invention. As can be seen, similar results are obtained to the STDR, although the signals have been shifted in frequency.

It should be noted that, even with correlation results computed at small fractions of the chip-time, improved accuracy may be obtained by interpolating adjacent correlation results. Accordingly, another embodiment of the present invention includes wherein the correlator is further configured to interpolate a plurality of correlation results to provide an improved accuracy correlation result. Various methods of interpolation are known in the art. One technique for interpolating is to find the vertical midpoints of both sides of the correlation peak, and from that, estimate the location of the center of the correlation peaks. Another method is to perform curve fitting by superimposing a copy of a basis function correlation peak over the correlation peak observed, and adjusting the basis function in amplitude and horizontal position until it matches peak from the reflected signal in the least means squares sense. Various methods to adjust the basis function are known, including linear search, gradient, conjugate gradient, Newton, and regularized Newton algorithms.

Another embodiment of the present invention further includes a processor or control element coupled to the correlator and configured to determine the characteristic of the signal path from the correlation result. The processor may be implemented using hardware, software, or a combination. Various characteristics, including impedance may be determined For example, a peak of the correlation result may occur at a time offset corresponding to the distance to an impedance discontinuity. The amplitude of the reflected signal will be proportional to the reflection coefficient, $$\Gamma_L = \frac{Z_L - z_0}{Z_L + z_0}$$

where $Z_L$ is impedance at the discontinuity and $z_o$ is the impedance of the wire. The reflection coefficient can take an any value between −1 and 1. Hence, the peak correlation result provides a measure of the reflection coefficient, which can be solved to find the impedance value at the discontinuity.

Figure 10:
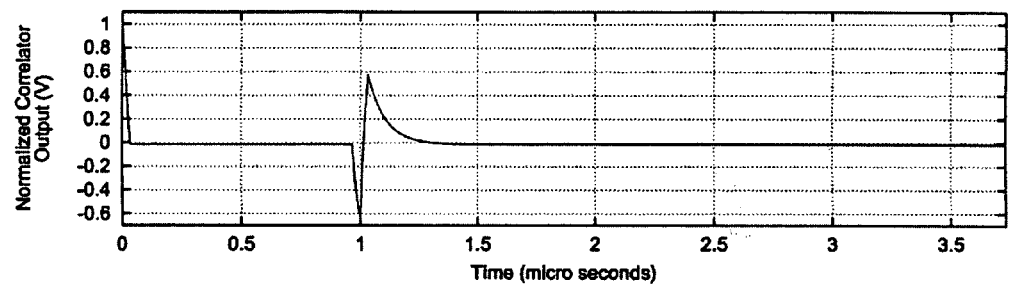
FIG. 10 is an illustration of the correlation result for a capacitive impedance discontinuity located at the end of a wire in accordance with an embodiment of the present invention.
Figure 11:
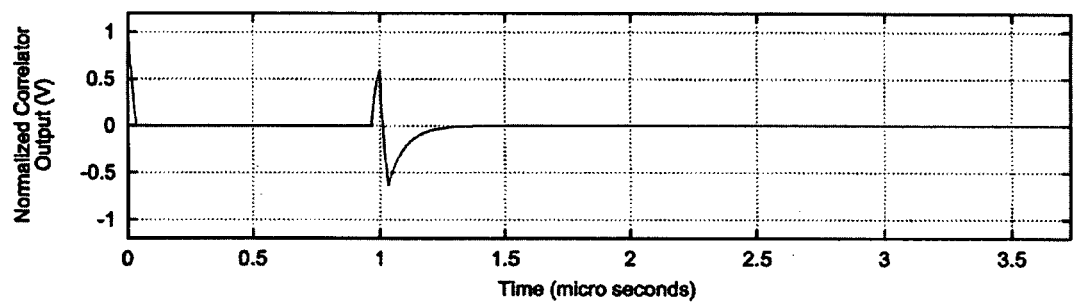
FIG. 11 is an illustration of the correlation result for an inductive impedance discontinuity located at the end of a wire in accordance with an embodiment of the present invention.

If the impedance discontinuity is complex, the reflection coefficient will also be complex, causing an additional phase delay in the reference spread-spectrum signal. FIG. 10 illustrates the correlation result for an example of a capacitance impedance discontinuity located at the end of the wire. FIG. 11 illustrates the correlation result for the example of an inductive impedance discontinuity located at the end of the wire.

Another embodiment of the present invention may further include a memory unit coupled to the processor and configured to store a history of the characteristic of the signal path. By storing a history, intermittent faults may be located. For example, a baseline correlation result may be obtained when the signal path has no anomalies, and later correlation results compared to the baseline to detect partial faults. Alternately, a window of past correlation results may be stored, and new correlation results compared to previous measurements, comparing to the first, the last, multiple, or an average of multiple measurements within this window.

Even if the circuit path under test is not fully open or short-circuited and an intermittent arc fault occurs, a "peak" in the correlation result may appear that represents the location of the arc fault. Several readings may be stored, and compared sequentially. The maximum differences between the average or median of the readings may be obtained. The arc fault may therefore show up as a peak in the maximum difference data at the location proportional to the location of the arc fault.

The fault location may be assumed to be centered about the location where the later correlation result deviates from the baseline. Baselining can also be used to provide for calibration, long term trend measurement, and removal of initial correlation peaks from impedance discontinuities at the location the reference spread-spectrum signal is injected and the location the reflected spread-spectrum signal is extracted.

The history storage may also be used to assist in locating intermittent faults on non-controlled impedance cables. The correlation result may be stored when a fault condition occurs, and the a technician may later use a probe to trace the wire, moving along the length of the wire until the correlation result obtained with the probe matches that stored for the failure condition.

Another embodiment of the present invention may include a circuit breaker coupled to the processor. The processor may be configured to trip the circuit breaker when a change in the characteristic of the signal path indicates a fault condition. For example, a sudden change in impedance, or the sudden appearance of additional peaks in the correlation result may indicate a fault condition caused by a short circuit.

In another embodiment of the present invention, more than one signal generator, interface, and correlator may be included. The additional signal generators may be configured to generate a reference spread-spectrum signal adapted so that the other reference spread-spectrum signals are substantially unaffected. This may permit testing of multiple signal paths simultaneously, while minimizing interference due to crosstalk.

Figure 9:
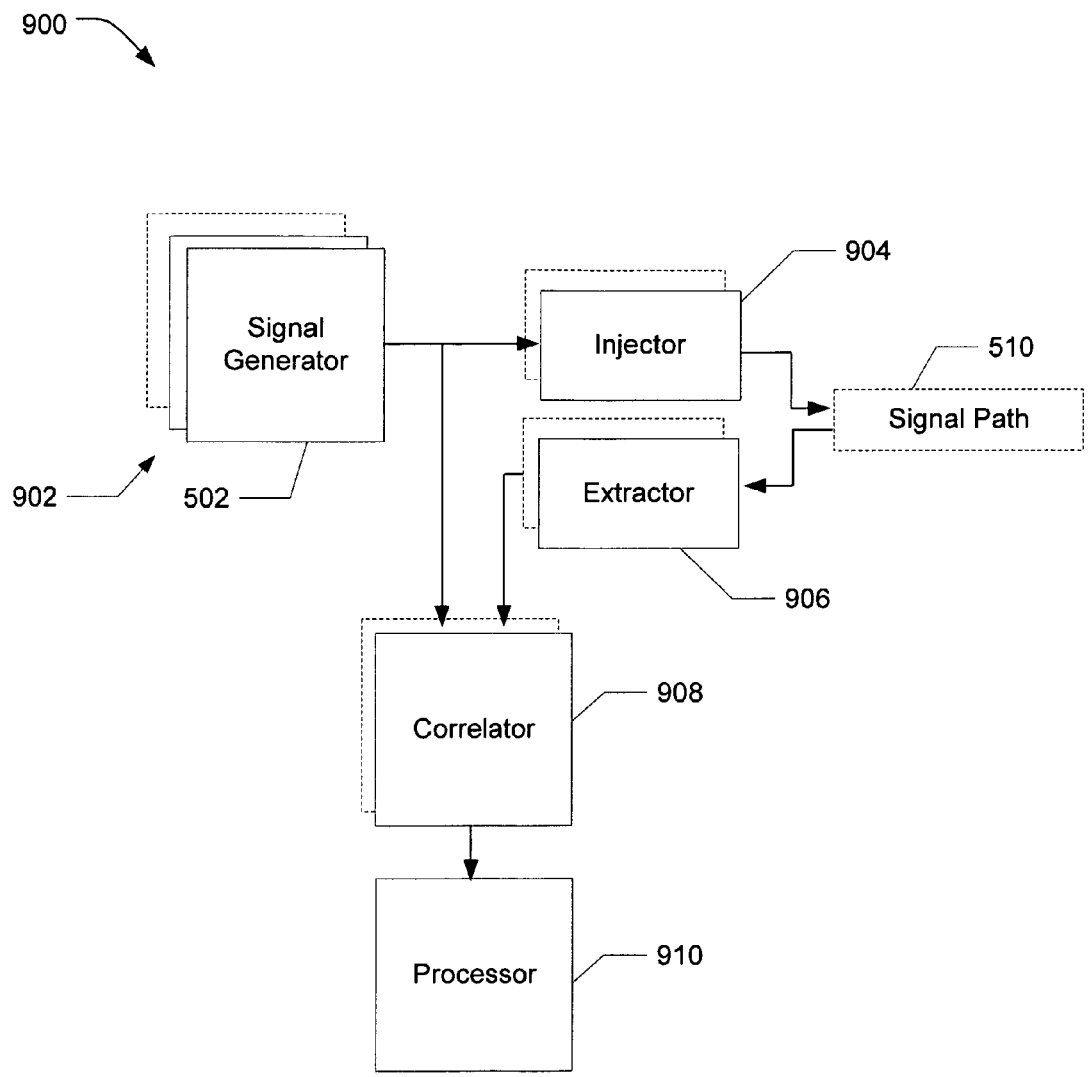
FIG. 9 is a block diagram of a system for detecting an anomaly in a signal path carrying an operational signal in accordance with another embodiment of the present invention.

A system 900 for detecting an anomaly in a signal path carrying an operational signal is illustrated in FIG. 9 in accordance with another embodiment of the present invention. The system may include a plurality 902 of signal generators 502 configured to generate a plurality of reference spread-spectrum signals wherein the plurality of reference spread-spectrum signals are adapted so that when applied to the signal path the operational signal is substantially unaffected. The system may further include at least one injector 904 coupled to the plurality of signal generators and configured to inject the plurality of spread-spectrum signals into the signal path 510. A single injector configured to inject multiple reference spread-spectrum signals may be included, or multiple injectors configured to each inject a single reference spread-spectrum signal may be included. If multiple injectors are used, the injectors may inject the reference spread-spectrum signals at the same or different places. The system may further include at least one extractor 906 coupled to the signal path and configured to extract a plurality of reflected spread-spectrum signals from the signal path generated by the anomaly in response to the plurality of reference spread-spectrum signals. The extractor(s) may be configured to extract the reference spread-spectrum signals from the same or different location than the injector(s). The system may further include at least one correlator 908 coupled to the plurality of signal generators and coupled to the at least one extractor and configured to correlate the plurality of reflected spread-spectrum signals with the plurality of reference spread-spectrum signal to produce a plurality of correlation results. A single correlator may be used to perform correlations for the different reference spread-spectrum signals at different times, or multiple correlators may be used to perform multiple correlations (for different reference spread-spectrum signals or different time-offsets) simultaneously. The system may further include a processor 910 coupled to the at least one correlator and coupled to the at least one extractor and configured to determine a location of the anomaly from the plurality of correlation results.

Figure 12:
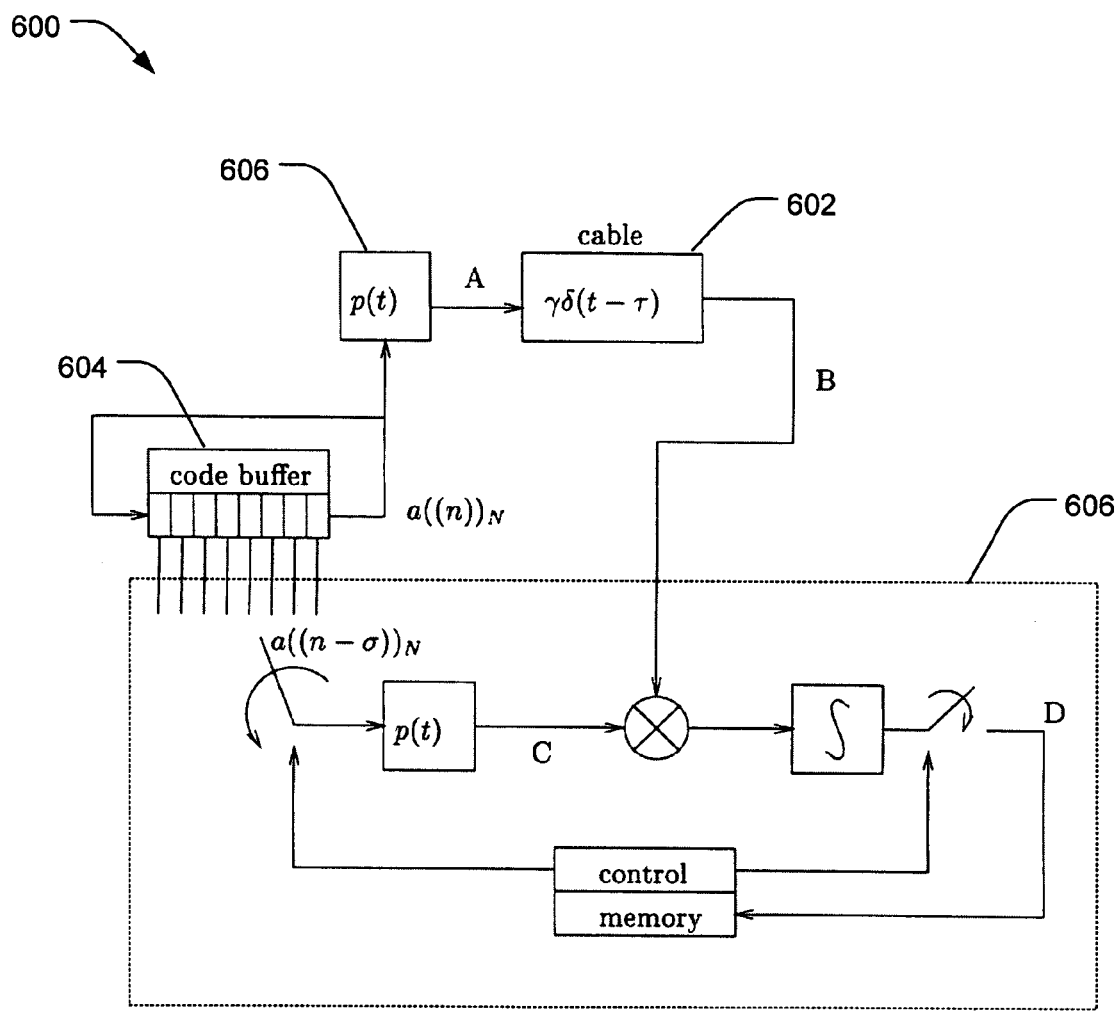
FIG. 12 is a block diagram of detailed implementation of a system for characterizing a signal path in accordance with an embodiment of the present invention.

FIG. 12 illustrates a detailed implementation of a system, shown generally at 600, for characterizing a signal path in accordance with an embodiment of the present invention. The signal path being tested 602 may be modeled as a continuous-time invariant system with impulse response $\gamma\delta(t-\tau)$ where $\tau$ is the time required for a signal to propagate from a transmitter (source) to a receiver (destination) over the signal path and $\gamma$ is the reflection coefficient.

A spread-spectrum signal is used to probe the signal path. The spread-spectrum signal is generated by a code. As shown in FIG. 12, the code may be generated by a circularly shifted code buffer 604. The code is represented herein as a sequence of bits a(n), where n=0, . . . N−1 where N is the number of bits in the code. The code bits are used to modulate a spreading pulse p(t) 606. Although amplitude modulation is presently preferred, phase or other forms of modulation may also be used.

Operation of the system of FIG. 12 will now be explained. The signal at point A and B may be represented as:

$$A: s(t) = \sum_{n=-\infty}^{\infty} a((n))_N p(t - nT_c)$$

$$B: s(t - \tau) = \gamma \sum_{n=-\infty}^{\infty} a((n))_N p(t - \tau - nT_c)$$

where by $A((n))_N$ is meant the code sequence a(n) is indexed modulo N (also referred to a circularly shifted). This mathematical notation corresponds to the circular shifting of the code buffer.

The code sequence is self-orthogonal in the following sense:

$$\sum_{n=0}^{N-1} a((n-\sigma))_N a((n-k))_N = \begin{cases} 1 & \sigma = k \\ 0 & \text{otherwise} \end{cases} = \delta(\sigma - k)$$

where $\delta$ is the Kronecker delta.

The parameter $T_c$ is the chip time or chip period. Dividing the time delay T by the chip time leads to:

$$\frac{\tau}{T_c} = k + \alpha \text{ or } \tau = (k + \alpha)T_c \; 0 \le \alpha < 1$$

where k is the whole number of chip times in the signal path delay and $\alpha$ is the fractional part of a chip time. If $\alpha$=0 then $\tau$ is in integer multiple of chip times. With this decomposition of the delay, the goal is to estimate the pair (k, $\alpha$). Using the previous two expressions and a change of variables, s(t−$\tau$) can be written as:

$$B: s(t - \tau) = \sum_{l=-\infty}^{\infty} a((l-k))_N p(t - \alpha T_c - lT_c)$$

The optimum (maximum likelihood) estimator of the time delay (assume white Gaussian noise may also be added by the signal path or sensor) is a filter matched to the signal s(t). The position in time of the peak in the matched filter output corresponds to the maximum likelihood estimate of the time delay. A correlation based circuit realization of the maximum likelihood filter is suitable for high frequency hardware implementation. The cross correlation circuit 606 is also shown in FIG. 12. The time delay estimate is taken to be the position of the peak in the cross correlation function between the received signal s(t−$\tau$) and a synthetically generated replica s(t−$\delta T_c$) at point C. Although only a single cross correlator is shown in FIG. 12 which sequentially computes the N values of the cross correlation function, multiple cross correlators may be included to allow parallel computation of the N values of the cross correlation function. The signal at point C in FIG. 10 is thus given by:

$$C: s(t - \sigma T_c) = \sum_{l=-\infty}^{\infty} a((n - \sigma))_N p(t - nT_c)$$

This signal is generated by a circular delay of the code bits relative to the code sequence used to generate the probe signal s(t). The output of the correlator at point D is thus given by:

$$r(\sigma) = \int_0^{NT_c} s(t - \sigma T_c) s(t - \tau) dt$$

$$= \gamma \left[ \sum_{n=-\infty}^{\infty} \sum_{l=-\infty}^{\infty} a((n-\sigma))_N a((l-k))_N \right.$$

$$\int_0^{NT_c} p(t - nT_c) p(t - \alpha T_c - lT_c) dt \Bigg]$$

$$= \gamma \left[ \sum_{n=-\infty}^{\infty} \sum_{l=-\infty}^{\infty} a((n-\sigma))_N a((l-k))_N [\delta(l-n)g(\alpha T_c) + \right.$$

$$\delta(l - n + 1) g([\alpha - 1]T_c)]]$$

$$= \gamma \left[ \sum_n a((n-\sigma))_N g(\alpha T_c) \sum_l a((l-k))_N \delta(l-n) + \right.$$

$$\sum_n a((n-\sigma))_N g([\alpha-1]T_c) \sum_l a((l-k))_N \delta(l-n+1) \Bigg]$$

$$= \gamma \left[ \sum_n a((n-\sigma))_N a((n-k))_N g(\alpha T_c) + \right.$$

$$\sum_n a((n-\sigma))_N a((n-1-k))_N g([\alpha-1]T_c) \Bigg]$$

$$= \gamma[g(\alpha T_c)\delta(\sigma - k) + g([\alpha-1]T_c)\delta(\sigma - k - 1)]$$

where the final step in the derivation above is enabled by the auto correlation property (high peak correlation at zero time-offset and low autocorrelation at other time-offsets) of the spreading code. The function g(t) above is equal to the autocorrelation function of the pulse p(t), given by:

$$g(\omega) = \int_0^{NT_c} p(t) p(t - \omega) dt$$

Although the above derivation has assumed that p(t) is time limited to a single chip period, this should not be considered limiting. Pulses that extend past a single chip period may also be used, although the final expression for r(σ) is no less useful although more complicated.

An examination of the cross correlation function reveals that r(σ) is equal to zero except when δ is equal to k or k+1. Recall that k is that the integer number of chip periods in the unknown delay τ. The function g(t), which is known, can be used to extrapolate between the non zero samples r(k) and r(k+1) to obtain the fractional delay α and the reflection coefficient γ. spread-spectrum signals enable high resolution estimation of τ and γ. Alternately, correlation may be performed at non-integer chip period, e.g. one-half, one-quarter, or smaller fractions of a chip period.

Multiple reflections are also possible. If there are L reflections present, the wire may be modeled by:

$$\sum_{i=1}^{L} \gamma_i \delta(t - \tau_i)$$

where $\gamma_i$ and $\tau_i$ are the reflection coefficients and time delays i=1, ... L. The time delays may be written in terms of whole and fractional parts:

$$\tau_i = (k_i + \alpha_i) T_c$$

All of the signal processing operations involved in calculating the correlation-based detector are linear and time invariant. Therefore, the correlator output is given by:

$$r(\sigma) = \sum_{i=1}^{L} \gamma_i [g(\alpha_i T_c) \delta(\sigma - k_i) + g([\alpha_i - 1]T_c) \delta(\sigma - k_i - 1)]$$

If all of these pulses are non-overlapping then each of the reflections may be resolved individually. If some of the reflections are closely spaced, then Fourier based techniques as known to those skilled in the art may also be applied to extract the time delays.

By selecting a wide bandwidth for the spread-spectrum signal or a long code, high signal to noise ratio to make a measurement of the wire characteristics may be obtained during the correlation process, even in the presence of noise or interference.

Figure 13:
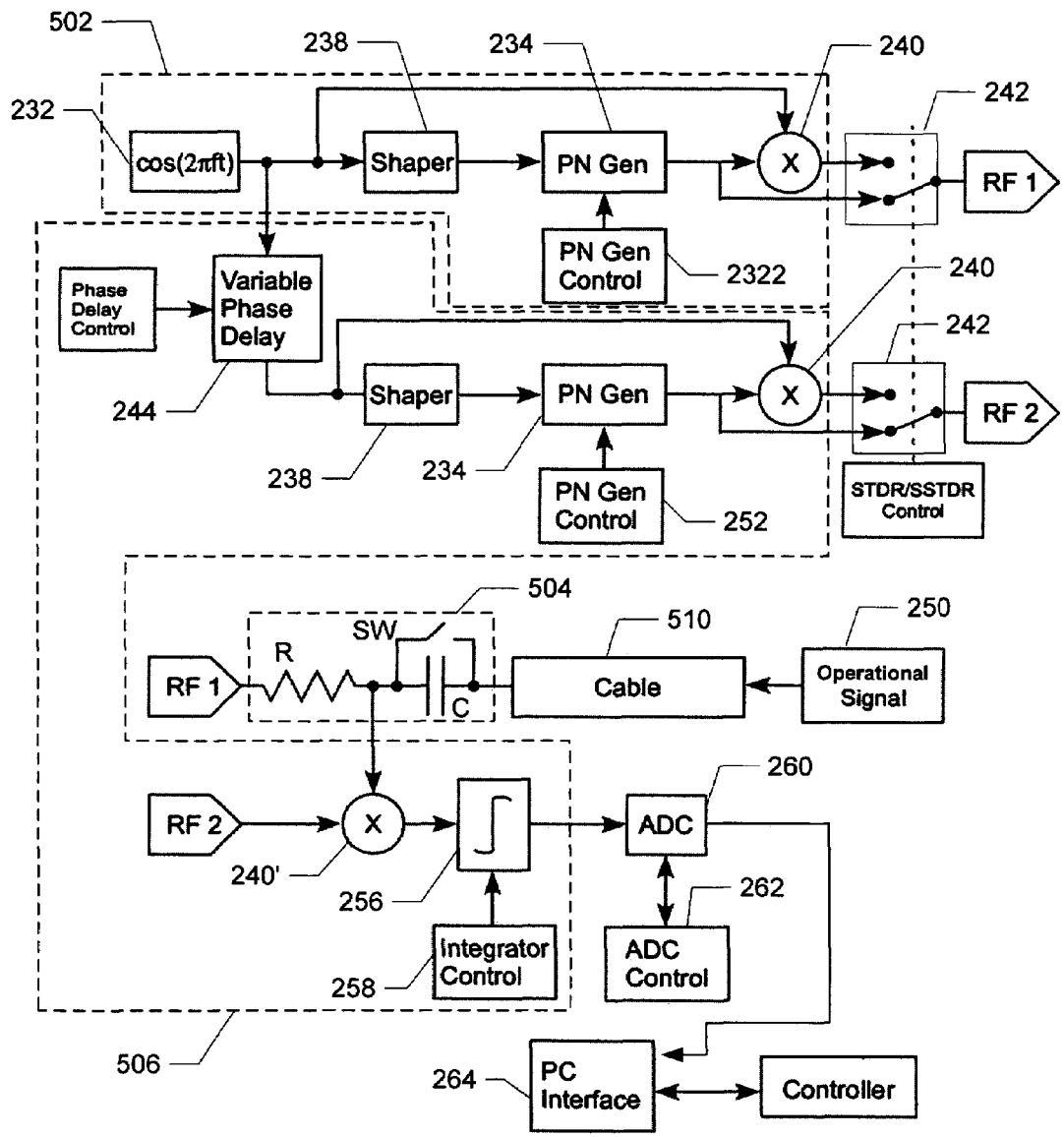
FIG. 13 is block diagram of an application of an embodiment of the present invention.

FIG. 13 illustrates a block diagram of an application of an embodiment of the present invention. The system may include a signal generator 502, an interface 504 and a processor 508. The signal generator 502 may be configured to generate either a STDR or SSTDR signal, or both simultaneously. The signal generator may include an oscillator 232. The signal generator may also include a PN generator 234. The oscillator may be used to provide the clock for the PN generator as shown here. A shaper 238 may be used to convert the sinewave output of the oscillator to a suitable square wave for clocking the PN generator. The oscillator may also be used to provide the carrier frequency for applying frequency offset to the PN sequence in a mixer 240. A switch 242 may be used to select either the STDR or SSTDR mode of operation.

The reference spread-spectrum signal (at point RF1) may be applied to a signal path or cable 510 through the interface 504. The interface may include a resister R. The resister may be used to help match the impedance of the cable. The interface may include a capacitor C. The capacitor may be used to help isolate the signal generator 502 from the cable, for example to prevent high DC or AC voltages on the line from damaging the signal generator or correlator 508. Various values of R and C may be selected to control the relative response of the coupler 504 to the reference spread-spectrum signal, reflected spread-spectrum signal, and operational signal 250. For STDR, it is preferable to use the switch SW to bypass the capacitor because STDR contains mostly low frequency spectral content. Other arrangements of the components in the interface may prove advantageous. For example, it may be useful to interchange the position of the capacitor and the resistor, as this may reduce distortion caused by the high pass filtering effect of the capacitor. Similarly, it may be useful to include a low pass pre-emphasis filter in the reference spread-spectrum signal path to compensate for the high pass filtering effect of the capacitor.

The correlator 506 may include a variable phase delay 244, coupled to a shaper 238, PN generator 234, and mixer 240 configured similarly to the signal generator to produce a phase delayed version of the reference spread-spectrum signal at point RF2. The variable phase delay may be used to time-offset the delayed version of the reference spread-spectrum signal by time-offsets of up to a chip-time. The time-offset may be adjusted in virtually any step desired. It is preferable that the time-offset be incremented in steps of less than one-quarter chip time. Time-offset in the delayed reference spread-spectrum signal may also be introduced by varying the start time of the delayed reference spread-spectrum signal relative to the reference spread-spectrum signal by one or more whole chip-time using the PN generator control 2322.

The correlator may also include a mixer 240'. The delayed reference spread-spectrum signal may be mixed with the reflected spread-spectrum signal using the mixer. The correlator may also include an integrator 256 and integrator control 258. The output of the integrator may provide a correlation result to the processor 508. The integrator control may reset the integrator at the beginning of a correlation interval (for example a particular time-offset) and trigger a sampling of the correlation result.

The processor 508 may include and analog to digital converter (ADC) 260 to convert the correlation result into a digital format for further analysis. The processor may further include an ADC control 262 to synchronize the ADC conversion time with the operation of correlator 506 and signal generator 502. The processor may further include a computer interface (PC interface) 264. The computer interface may be used to allow computer control operation of the system, and to allow computer analysis of the correlation results.

Some of the devices where embodiments of the present invention can be used include a stand-alone dedicated device, an integrated assembly within system component, an add-on into an existing system component, a multi-function measurement device, a laptop computer, a desktop personal computer, in the insulation of the wire, in a connector between wires, on a circuit board that can be installed in after-market devices, in an arc-fault circuit breaker, in a battery, in an add-on assembly for insertion between a probe and multi-function meter, and in probes that can be used with after-market devices.

The stand-alone and multi-function measurement devices are of particular importance. Consider a FLUKE™ multi-meter device. The system 500 may be installed inside the FLUKE™ device so that measuring short circuits and open circuits is simply another option on a dial. The handheld device may have the capability of displaying the distance, for example, in meters to the anomaly. In those situations where the system is an aftermarket addition, the handheld device may display the voltage, and then the user may translate the voltage to a distance reading.

Such a handheld device might be provided with a connector that allows easy connection of the device to a connectorized wiring harness. A multiplexer or switch may be used to switch to each wire in the harness individually. This greatly increases the convenience of such a test instrument and the reliability of test results, since the user need not move a probe to each wire or connector pin.

The handheld device has been described as a FLUKE™ multimeter device. However, there are other handheld computational and measurement devices that can also be used. For example, consider the Juniper™ Ruggedized Handheld PC.

The system 500 may also be constructed to fit into a slot in a measurement device, wherein the slot is provided so that functionality can be added to existing devices. Thus, the ability to retro-fit existing devices is an important application of the presently disclosed inventive concepts.

The versatility of where embodiments of the present invention can be implemented should now be apparent. Owing to the low cost, small size, and simplicity of design, an embodiment of the present invention may be integrated directly into new products, function as a stand-alone device, or be manufactured as an add-on for use in combination with other devices.

The arc-fault circuit breaker is an application of particular importance. A circuit breaker is a commonly available junction point in a circuit. Arc faults can be very small, and even invisible to the unaided eye. It is very difficult to be able to repair the wire if the fault cannot be seen. The system 500 may enable the presence and location of an arc fault to be determined to a high degree of accuracy. The system may be integrated into existing or new circuit breakers, or otherwise placed within a circuit breaker panel. Power required to operate the present invention may conveniently be obtained directly from the wire signal path tested.

The system 500 may also be integrated into the connectors of a wiring harness. Existing connectors may be replaced or a separate "connector-saver" that has male pins on one side and female sockets on the other so that the existing connectors may be plugged into either side of this connector-saver. The new connectors and connector-saver may each contain the presently disclosed inventive techniques, permitting in-system testing for anomalies within the wiring harness.

There are a number of options in powering a connector that includes the system 500 integrated within. For example, the connector may connect to power within the bundle being tested. Alternatively, the connector may include a battery (possibly rechargeable). Yet another alternative in the context of aircraft wiring, the connector may scavenge power from the surroundings using vibration, thermal changes, or other well-known power scavenging methods.

In addition, these connectors may provide a communication interface to get anomaly data back to a central location for examination by a maintenance technician, operator, pilot, remote decision-making interface, or the like. In order to do this, each connector may include a communication link that could be either hard-wired or wireless, e.g., RF, IR, etc. The connector may be examined visually or individually. The examination may be facilitated with a set of LED outputs, or a hard-wired or wireless connection between a handheld PDA, for example and not by way of limitation.

If there are more than two wires within the bundle, the connector may include a multiplexer or set of switches to test each of the wires separately. Alternatively, the system may be built into a single chip, embedded into the connector and may test the set of several wires simultaneously.

It has been contemplated that as the electronics for the system 500 are reduced in size by manufacturing improvements and miniaturization, that it may be imbedded directly within a roll of wiring. Multiple or single units might be included within a roll of wiring. This application is particularly appealing for new types of wires that are being examined that are extruded and may be connected onto small circuit boards rather than the traditional connectors or for wires that are built on rolls of high-impedance plastic. These are the same materials, in some cases, that flexible circuit boards can be built on and, thus, that the system may be attached to.

One of the more immediate applications of the present inventive technique is the ability to use a handheld device for testing wires for short and open circuits. For example, airplane wiring can be tested using embodiments of the present invention, even when there is no return path. Thus, a single wire can be tested.

Testing with the various embodiments disclosed within have demonstrated that it is feasible to perform testing while operational signals are present and achieve excellent performance results. Test were performed on signal paths both with and without operational signals. Operational signals were simulated for 400 Hz AC power, 60 Hz AC power, and Mil-Std 1553 bus data. Accuracy obtained ranged from about ±0.2 feet for controlled impedance cables to ±1.0 for non-controlled impedance cables in locating various types of anomalies.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A method of characterizing a signal path comprising
   (i) generating a reference spread-spectrum signal wherein a spectrum of the reference spread-spectrum signal is shaped to substantially inversely mirror a spectrum of an operational signal present in the signal path;
   (ii) coupling the reference spread-spectrum signal into the signal path while the signal path is carrying the operational signal;
   (iii) receiving a reflected spread-spectrum signal from the signal path generated in response to the reference spread-spectrum signal; and
   (iv) correlating the reflected spread-spectrum signal with the reference spread-spectrum signal to produce a correlation result corresponding to a characteristic of the signal path.

2. The method of claim 1, wherein generating a reference spread-spectrum signal further comprises adapting the reference spread-spectrum signal so that the operational signal is substantially unaffected by the spread-spectrum signal.

3. The method of claim 1, wherein generating a reference spread-spectrum signal further comprises adapting the reference spread-spectrum signal so that the correlation result is substantially unaffected by the operational signal.

4. The method of claim 1, wherein generating the reference spread-spectrum signal further comprises setting a signal level of the reference spread-spectrum signal below a noise threshold of the operational signal.

5. The method of claim 1, wherein generating a reference spread-spectrum signal further comprises translating a baseband pseudo-noise sequence by a frequency offset to produce the reference spread-spectrum signal.

6. The method of claim 1, wherein correlating the reflected signal with the reference spread-spectrum signal further comprises shifting a time-reference of the reference spread-spectrum signal in increments of less than a chip-time.

7. The method of claim 1, wherein correlating the reflected signal with the reference spread-spectrum signal further comprises shifting a time-reference of the reference spread-spectrum signal in increments of less than a one-quarter chip-time.

8. The method of claim 1 further comprising processing the correlation result to determine the characteristic of the signal path.

9. The method of claim 8, wherein processing the correlation result further includes adjusting a system operation based on a characteristic of the signal path.

10. A method of testing a signal path having an anomaly, comprising:
  generating a first reference spread-spectrum signal and a second reference spread-spectrum signal;
  coupling the first spread-spectrum signal into the signal path at a first location while the signal path is carrying an operational signal;
  coupling the second spread-spectrum signal into the signal path at a second location different than the first location while the signal path is carrying the operational signal;
  receiving at a third location a first reflected spread-spectrum signal from the signal path generated by the anomaly in response to the first and second spread-spectrum signals;
  receiving at a fourth location a second reflected spread-spectrum signal from the signal path generated by the anomaly in response to the first and second spread-spectrum signals;
  correlating the first reflected spread-spectrum signal with the first reference spread-spectrum signal to produce a first correlation result;
  correlating the second reflected spread-spectrum signal with the second reference spread-spectrum signal to produce a second correlation result; and
  combining the first correlation result and the second correlation result to determine a location of the anomaly having increased accuracy relative to a location determined using either the first correlation result or the second correlation result alone.

11. The method of claim 10 wherein generating the first and second reference spread-spectrum signals further comprises formatting the first and a second spread-spectrum signals so that the operational signal is substantially unaffected.

12. The method of claim 10, wherein generating a first and second spread-spectrum signals further comprises formatting a first and second spread-spectrum signal so that each is substantially unaffected by the other.

13. The method of claim 10, further comprising:
  embedding the first correlation result in the first reference spread-spectrum signal; and
  communicating the first correlation result from the first location to the fourth location.

14. The method of claim 13, further comprising:
  embedding the second correlation result in the second reference spread-spectrum signal; and
  communicating the second correlation result from the second location to the third location.

15. The method of claim 10, further comprising the step of shaping each of a spectrum of the first reference spread-spectrum signal and a spectrum of the second reference spread-spectrum signal to substantially inversely mirror a spectrum of the operational signal.

16. A system for characterizing a signal path carrying an operational signal comprising:
  a signal generator configured to generate a reference spread-spectrum signal wherein the reference spread-spectrum signal has a spectrum shaped to substantially inversely mirror a spectrum of the operational signal;
  an interface coupled to the signal generator and configured to inject the reference spread-spectrum signal into the signal path and configured to extract a reflected spread-spectrum signal from the signal path generated in response to the reference spread-spectrum signal; and
  a correlator coupled to the signal generator and coupled to the interface and configured to correlate the reflected spread-spectrum signal with the reference spread-spectrum signal to produce a correlation result corresponding to a characteristic of the signal path.

17. The system of claim 16 wherein the signal generator is configured to set a signal level of the reference spread-spectrum signal below a noise threshold of the operational signal.

18. The system of claim 16 wherein the signal generator is configured to set a bandwidth of the reference spread-spectrum signal much greater than a bandwidth of the operational signal.

19. The system of claim 16 wherein the interface further comprises a isolator.

20. The system of claim 16 wherein the correlator is further configured to suppress an interference from the operational signal.

21. The system of claim 16 wherein the correlator is further configured to generate the correlation result for a time-offset of less than a chip-time.

22. The system of claim 16 wherein the correlator is further configured to interpolate a plurality of correlation results to provide an improved accuracy correlation result.

23. The system of claim 16 wherein the correlator is further configured to detect an intermittent change in the correlation result.

24. The system of claim 16 further comprising a processor coupled to the correlator and configured to determine the characteristic of the signal path from the correlation result.

25. The system of claim 24 further comprising a memory unit coupled to the processor and configured to store a history of the characteristic of the signal path.

26. The system of claim 24 further comprising a circuit breaker coupled the processor wherein the processor is further configured to trip the circuit breaker when a change in the characteristic of the signal path indicates a fault condition.

27. The system of claim 16 further comprising:
  a second signal generator configured to generate a second reference spread-spectrum signal wherein the second reference spread-spectrum signal is adapted so that when applied to a second signal path carrying a second operational signal the second operational signal is substantially unaffected and wherein the second reference spread-spectrum signal is adapted so that the (first) reference spread-spectrum signal is substantially unaffected;

a second interface coupled to the second signal generator and configured to inject the second reference spread-spectrum signal into the second signal path and configured to extract a second reflected spread-spectrum signal from the second signal path in response to the second reference spread-spectrum signal; and a second correlator coupled to the second signal generator and coupled to the second interface and configured to correlate the second reflected spread-spectrum signal with the second reference spread-spectrum signal to produce a second correlation result corresponding to a characteristic of the second signal path.

28. The system of claim 16 further comprising a store and compare unit configured to store a baseline and compare the correlation result to the baseline.

29. The system of claim 16, further comprising a circuit breaker associated with the signal path wherein the system is installed within a housing of the circuit breaker.

30. The system of claim 16, further comprising a connector associated with the signal path wherein the system is installed within a housing of the circuit breaker.

31. An electronic system for detecting an anomaly in a signal path carrying an operational signal comprising:

a plurality of signal generators configured to generate a plurality of reference spread-spectrum signals wherein the plurality of reference spread-spectrum signals each have a spectrum shaped to substantially inversely mirror a spectrum of the operational signal;

at least one injector coupled to the plurality of signal generators and configured to inject the plurality of spread-spectrum signals into the signal path;

at least one extractor coupled to the signal path and configured to extract a plurality of reflected spread-spectrum signals from the signal path generated by the anomaly in response to the plurality of reference spread-spectrum signals;

at least one correlator coupled to the plurality of signal generators and coupled to the at least one extractor and configured to correlate the plurality of reflected spread-spectrum signals with the plurality of reference spread-spectrum signal to produce a plurality of correlation results; and a processor coupled to the at least one correlator and configured to determine a location of the anomaly from the plurality of correlation results.

32. A spread-spectrum reflectometer comprising:

a spread-spectrum signal generator configured to generate a spread-spectrum signal having associated with said spread-spectrum signal a code and a pulse shape having a spectrum shaped to substantially inversely mirror a spectrum of the operational signal and configured so that said spread-spectrum signal may be coupled into a wire; and a correlator configured to compute a correlation result between said spread-spectrum signal and a reflected version of said spread-spectrum signal received from said wire whereby a property of said wire may be extracted from said correlation result.

33. The spread-spectrum reflectometer of claim 32 wherein said spread-spectrum signal generator is configured to produce a wide bandwidth, low power signal suitable for injection into an operating system without interfering with said operating system.

34. The spread-spectrum reflectometer of claim 32 wherein said code is selected to be self-orthogonal.

35. The spread-spectrum reflectometer of claim 32 wherein said property is selected to be a delay associated with said reflected spread-spectrum signal whereby a distance to an anomaly of said wire may be determined.

36. The spread-spectrum reflectometer of claim 32 wherein said property is selected to be a reflection coefficient associated with said reflected spread-spectrum signal whereby a character of an anomaly of said wire may be determined.

37. The spread-spectrum reflectometer of claim 32 further comprising a modulator coupled to said spread-spectrum signal generator said modulator being configured to shift said spread-spectrum signal in frequency.

38. The spread-spectrum reflectometer of claim 32 further comprising a control element coupled to said correlator and configured to extract more than one property of said wire from said correlation result.

* * * * *